United States Patent [19]
Hoang

[11] Patent Number: 5,497,112
[45] Date of Patent: Mar. 5, 1996

[54] POWER-OUT RESET SYSTEM

[75] Inventor: Chinh L. Hoang, San Diego, Calif.

[73] Assignee: General Instrument Corporation of Delaware, Hatboro, Pa.

[21] Appl. No.: 274,046

[22] Filed: Jul. 12, 1994

[51] Int. Cl.[6] ................................................. H03L 17/22
[52] U.S. Cl. ............................................ 327/143; 327/74
[58] Field of Search ...................................... 327/143, 198, 327/74, 545

[56] References Cited

U.S. PATENT DOCUMENTS

| | | | |
|---|---|---|---|
| 3,989,958 | 11/1976 | Renirie et al. ............................ | 327/74 |
| 4,613,770 | 9/1986 | Raab ......................................... | 327/74 |
| 5,232,067 | 6/1994 | Shay ......................................... | 327/142 |
| 5,319,601 | 6/1994 | Kawata et al. ........................... | 327/143 |
| 5,336,947 | 8/1994 | Lehning ................................... | 327/18 |
| 5,402,083 | 3/1995 | Shekhawat et al. ..................... | 327/74 |

FOREIGN PATENT DOCUMENTS

| | | | |
|---|---|---|---|
| 58-206230 | 12/1983 | Japan ...................................... | 327/143 |
| 59-154821 | 9/1984 | Japan ...................................... | 327/143 |
| 5-218834 | 8/1993 | Japan ...................................... | 327/143 |
| 1338047 | 9/1987 | U.S.S.R. .................................. | 327/143 |

*Primary Examiner*—Terry Cunningham
*Attorney, Agent, or Firm*—Irwin Ostroff

[57] ABSTRACT

A power-out reset circuit includes reference voltage and current generators to generate a reference voltage and a reference current which are essentially independent of temperature variations over a useful temperature range, a delay/disable circuit, over and under voltage detectors and output logic circuitry. This circuit detects when the voltage level of a supply voltage source (+VDD) exceeds preselected limits. The reference voltage, which is related to the silicon band gap voltage, is connected to a first input of a comparator of each of the voltage detectors. The reference current, which is derived from the silicon band gap voltage, is connected to a current source of each of the detectors. Each detector has a hysteresis circuit which changes the point at which the comparator switches in the event that +VDD crosses into or outside of a preselected operating range. The delay/disable circuit ensures that the reference voltage is stable before the voltage detectors are activated, and that the voltage detectors are disabled when the supply voltage source falls below a minimum value which causes the reference voltage to be invalid (i.e., to be outside the preselected operating range). Outputs of the comparators are coupled to the output logic circuitry. The output logic circuitry includes a two input EXCLUSIVE OR logic circuit, a delay circuit, a two input OR logic gate, a transistor, a two input NOR logic gate, and an inverter.

29 Claims, 5 Drawing Sheets

POWER-OUT RESET SYSTEM

FIELD OF THE INVENTION

This invention relates to power-out reset systems useful with integrated circuits (ICs) to determine when the output voltage of a supply voltage source (voltage source) exceeds preselected high and low voltage levels for operation of the IC.

BACKGROUND OF THE INVENTION

Many integrated circuits (ICs) operate with a supply voltage source whose output is at a nominal level (i.e., +VDD) which can be allowed to vary only within preselected limits (i.e., a voltage range) before the ICs fail to operate properly. Power-out reset circuits are used to monitor the level of +VDD and to provide a signal when the level of +VDD exceeds the preselected voltage range on the high side or the low side of the voltage range. Typically +VDD is used to power both the ICs and the power-out reset circuits.

One such typical power-out reset circuit uses voltage generators to generate reference voltages, i.e., Vbg (the silicon bandgap voltage) and VIbg (a reference voltage related to the band gap current) which serve as inputs to over voltage and under voltage detectors which each have a comparator circuit which compares Vbg to an attenuated +VDD. Vbg is typically essentially constant in voltage over a useful temperature range. VIbg is typically coupled to a control terminal of a current source of each of the voltage detectors. VIbg is characterized such that the current it causes to be generated by the current source is essentially constant over a useful temperature range. Each detector compares the voltage level of Vbg with that of an attenuated level of the actual level of +VDD. If the level of +VDD is higher than a preselected high level (+Vhigh), the over voltage detector provides an output signal indicative of this condition. If the level of +VDD is lower than a preselected low level (+Vlow), the under voltage detector provides an output signal indicative of this condition. Output logic circuitry coupled to outputs of the over and under voltage detectors provides an output signal which is indicative of whether the voltage level of +VDD is within the preselected voltage level limits (+Vhigh to +Vlow) or outside of same.

There are commonly encountered problems such as false triggering at power-up due to the comparators becoming active before the reference voltage (Vbg) has stabilized, false triggering during normal operation due to noise glitches, and a false indication of normal operation at low +VDD after the reference voltages have become invalid.

It is desirable to have a power-on reset circuit which reduces the above described problems.

SUMMARY OF THE INVENTION

Viewed from one aspect, the present invention is directed to circuitry for detecting if a voltage level of a voltage source exceeds preselected voltage levels. The circuitry comprises reference voltage generator means, delay/disable means, and voltage detector means. The reference voltage generator means generates first and second reference voltages at first and second outputs, respectively, thereof. The delay/disable means, which has an input coupled to the second output of the reference voltage generator means, and which has an output, generates, after a predetermined delay, a third reference voltage at the output of the delay/disable means, and generates a disable output signal at the output of the delay/disable means if the voltage level of the voltage source is below a minimum level. The voltage detector means, which has a first input which is coupled to the first output of the reference voltage generator means, which has a second input coupled to the output of the delay/disable means, and which has a third input connectable to the voltage source through a voltage translator network, detects if the voltage level of the voltage source is within the preselected voltage levels and generates at an output thereof a signal indicative of whether the voltage level of the voltage source is within or outside the preselected voltage levels, and is disabled if the voltage level of the voltage source is below the minimum level.

Viewed from an other aspect, the present invention is directed to circuitry for detecting if a voltage level of a voltage source exceeds preselected voltage levels. The circuitry comprises reference voltage generator means and voltage detector means. The reference voltage generator means generates first and second reference voltages at first and second outputs, respectively, thereof. The voltage detector means, which has first and second inputs that are coupled to the first and second outputs, respectively, of the reference voltage generator means, and which has a third input connectable to the voltage source through a voltage translator network, detects if the voltage level of the voltage source is within the preselected voltage levels and generates at an output thereof a signal indicative of whether the voltage level of the voltage source is within or outside the preselected levels. The voltage detector means further comprises hysteresis means, which has an output coupled to the voltage translator network, and which has an input coupled to the output of the voltage detector, that selectively modifies a voltage generated at the third input of the voltage detector means so as to improve noise margin.

Viewed from still an other aspect, the present invention is directed to circuitry for detecting if the voltage level of a voltage source exceeds preselected voltage levels. The circuitry comprises reference voltage generator means, voltage detector means, and output logic circuitry means. The reference voltage generator means generates first and second reference voltages at first and second outputs, respectively, thereof. The voltage detector means, which has first and second inputs that are coupled to the first and second outputs, respectively, of the reference voltage generator means, and which has a third input connectable to the voltage source through a voltage translator network, detects if the voltage level of the voltage source is within the preselected voltage levels and generates at an output thereof a signal indicative of whether the voltage level of the voltage source is within or outside the preselected voltage levels. The output logic circuitry means, which has inputs coupled to outputs of the voltage detector means, and which has an output which serves as the circuitry output, detects if the voltage level of the voltage source is within the preselected voltage levels or outside of same, and if the voltage level of the supply source had exceeded the preselected voltage levels and then changed to a level within the preselected voltage levels, delays a change in an output signal generated at the output circuitry terminal.

Viewed from still an other aspect, the present invention is directed to circuitry for detecting if a voltage level of a voltage source exceeds preselected voltage levels. The circuitry comprises reference voltage generator means, delay/disable means, voltage detector means, and output logic circuitry means. The reference voltage generator means generates first and second reference voltages at first and second outputs, respectively, thereof. The delay/disable means, which has an input coupled to the second output of the reference voltage generator means, and which has an output, generates, after a predetermined delay, a third reference voltage at the output of the delay/disable means, and generates a disable output signal at the output of the delay/disable means if the voltage level of the voltage source is below a minimum level. The voltage detector means, which has a first input which is coupled to the first output of the reference voltage generator means, which has a second input coupled to the output of the delay/disable means, and which has a third input connectable to the voltage source through a voltage translator network, detects if the voltage level of the voltage source is within the preselected voltage levels and generates at an output thereof a signal indicative of whether the voltage level of the voltage source is within or outside the preselected voltage levels, and is disabled if the level of the voltage of the voltage source is below the minimum level. The voltage detector means further comprises hysteresis means, which is coupled to the voltage translator network, and which has an input coupled to an output of the voltage detector means, that selectively modifies a voltage generated at the third input of the voltage detector means such that an output signal of the voltage detector means has an increased tendency not to switch states due to relatively short duration changes in the voltage level of the voltage source due to noise. The output logic circuitry means, which has inputs coupled to outputs of the voltage detector means, and which has an output which serves as the circuitry output, detects if the voltage level of the voltage source is within the preselected voltage levels or outside of same, and if the voltage level of the voltage source exceeded the preselected voltage levels and then returned to a voltage level within the preselected voltage levels, delays any change in a signal generated at the output circuitry terminal such that a resulting output signal at the circuitry output terminal has an increased tendency not to switch states due to relatively short duration changes in the voltage level of the voltage source due to noise after the output logic circuitry means has provided an output signal at the output thereof indicating the voltage level of the voltage source is outside the preselected voltage levels.

Viewed from still an other aspect, the present invention is directed to a voltage detector. The voltage detector comprises a current generator, a comparator, a voltage translator network, and hysteresis means. The comparator, which is coupled to the current generator, has first and second voltage sensitive inputs and an output. The first voltage sensitive input is connectable to a first reference voltage. The voltage translator network has first, second, and third inputs and an output. The first input of the voltage translator network is connectable to a voltage source whose voltage level can vary, and the second input of the network is connectable to a second reference voltage. The hysteresis means, which has an input coupled to the output of the comparator and has an output coupled to the third input of the voltage translator network, selectively modifies a voltage generated by the voltage translator network at the second voltage sensitive input of the comparator so as to improve noise margin.

Viewed from still an other aspect, the present invention is directed to logic circuitry. The logic circuitry comprises first means, delay means, and second means. The first means, which has an output coupled to a logic circuitry output, detects if a voltage level of a voltage source is outside a preselected voltage range about a nominal voltage level and rapidly generates at the output thereof a signal having a first logic state which indicates that the voltage level of the voltage source is outside the preselected voltage range. The delay means, which has an output coupled to the logic circuitry output and has an input, transmits signals therethrough to the logic circuitry output with a predetermined delay. The second means, which has an output coupled to the input of the delay means, detects if the voltage level of the voltage source is within or outside the preselected voltage range and generates at the output thereof a signal having a first logic state if the voltage level of the voltage source is outside the preselected voltage range and a second logic state if the voltage level of the voltage source is within the preselected voltage range.

A better understanding of the invention together with a fuller appreciation of its important advantages will best be gained from a study of the following description given in conjunction with the accompanying drawings and claims.

DETAILED DESCRIPTION

Figure 1:
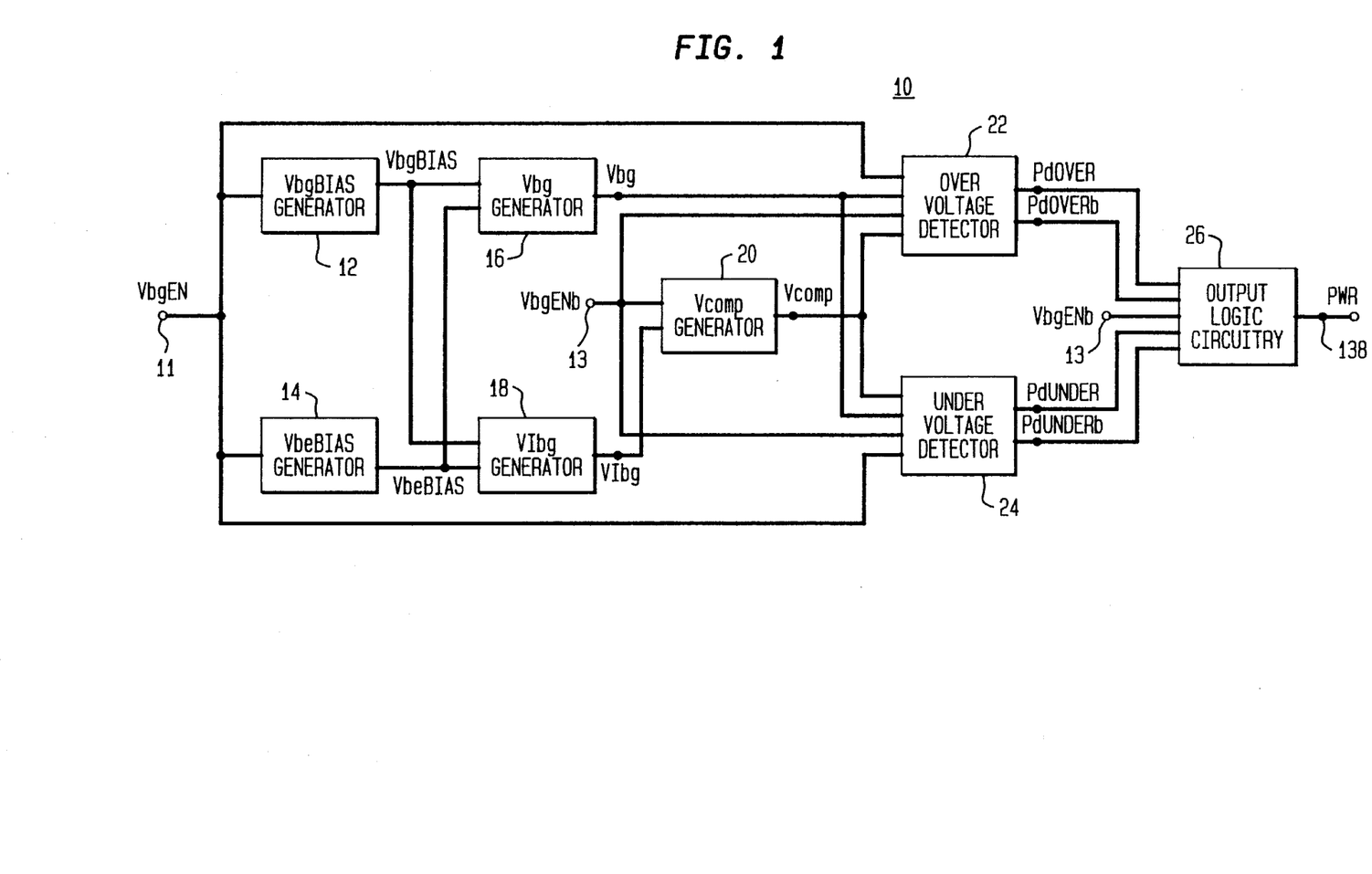
FIG. 1 shows in block diagram form a power-out reset system in accordance with the present invention.

Referring now to FIG. 1, there is shown, in block diagram form, a power-out reset system 10 in accordance with the present invention. Power-out reset system 10 detects when the voltage level of a supply voltage source (also denoted as "a voltage source", e.g., +VDD shown in FIGS. 2–6) exceeds preselected high (+Vhigh) and low (+Vlow) limits or levels (i.e., a voltage range of +Vhigh to +Vlow) from a nominal level with respect to a fixed lower reference potential (e.g., VSS shown in FIGS. 2–6). System 10 generates at an output (PWR) of output logic circuitry 26 a high, a digital "1", if the supply voltage source voltage level is within the preselected limits (+Vhigh to +Vlow), and generates a low, a digital "0", if the supply voltage source voltage level is outside the preselected limits (levels, range).

Power-out reset system 10 comprises a VbgBIAS generator 12, a VbeBIAS generator 14, a Vbg generator 16, a VIbg generator 18, a Vcomp generator 20, an over voltage detector 22, an under voltage detector 24, and the output logic circuitry 26. An output VbgBIAS of generator 12 is coupled to first inputs of generators 16 and 18. An output VbeBIAS of generator 14 is coupled to second inputs of generators 16 and 18. An output Vbg of generator 16 is coupled to first inputs of over voltage detector 22 and under voltage detector 24. An output VIbg of generator 18 is coupled to a first input of Vcomp generator 20. An output Vcomp of generator 20 is coupled to second inputs of detectors 22 and 24. First (PdOVER) and second (PdOVERb) complementary outputs of detector 22 are coupled to first and second inputs, respectively, of circuitry 26. First (PdUNDER) and second (PdUNDERb) complementary outputs of detector 24 are coupled to third and fourth inputs, respectively, of circuitry 26. An enable terminal (VbgEN) 11 is coupled to first inputs of generators 12 and 14, and to third inputs of detectors 22 and 24. A terminal (VbgENb) 13 is coupled to a second input of generator 20, to fourth inputs of detectors 22 and 24, and to a fifth input of circuitry 26. Terminals 11 (VbgEN) and 13 (VbgENb) receive complementary signals.

When terminal 11 (VbgEN) is a "1" and terminal 13 (VbgENb) is a "0", power-out reset system 10 is coupled to +VDD and VSS and functions normally. When terminal 11 (VbgEN) is a "0" and terminal 13 (VbgENb) is a "1", system 10 is disabled.

VbgBIAS generator 12, Vbg generator 16, VbeBIAS generator 14 and VIbg generator 18 may be denoted as reference voltage generator means. Vcomp generator 20 may be denoted as delay/disable means. Over voltage detector 22 and under voltage detector 24 may be denoted as voltage detector means. Output logic circuitry 26 may be denoted as output logic circuitry means.

Figure 2:
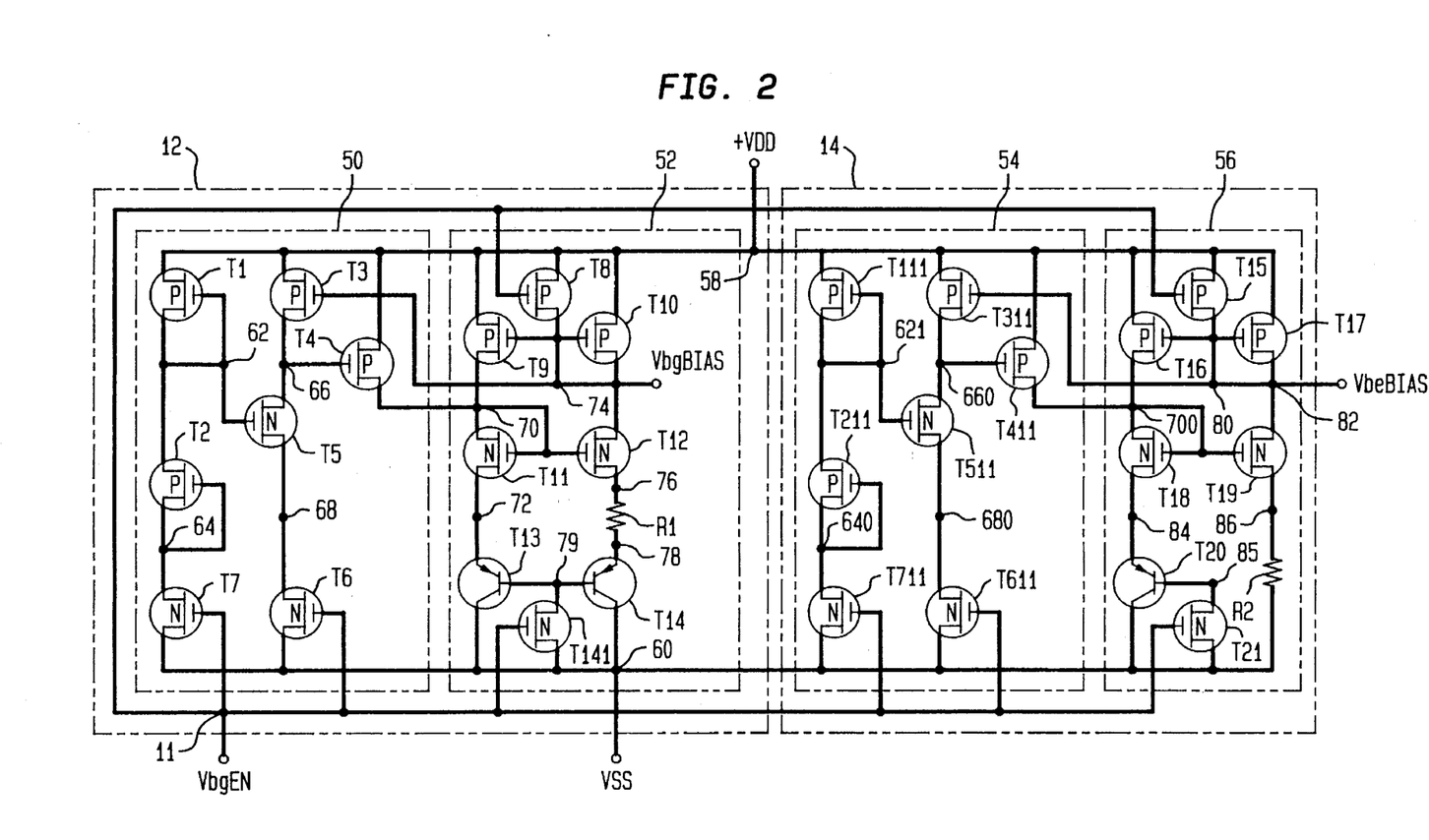
FIG. 2 shows preferred embodiments of a VbgBIAS generator and a VbeBIAS generator of FIG. 1.

Referring now to FIG. 2, there is shown within a dashed line rectangle 12 a preferred embodiment of VbgBIAS generator 12 of FIG. 1 and within a dashed line rectangle 14 is shown a preferred embodiment of VbeBIAS generator 14 of FIG. 1. VbgBIAS generator 12 comprises a start-up portion shown within a dashed line rectangle 50 and a generator portion shown within a dashed line rectangle 52. VbeBIAS generator 14 comprises a start-up portion shown within a dashed line rectangle 54 and a generator portion shown within a dashed line rectangle 56. VbgBIAS generator 12 generates an output voltage VbgBIAS at an output terminal 74 thereof. VbeBIAS generator 14 generates an output voltage VbeBIAS at an output terminal 82 thereof.

The start-up portion 50 of VbgBIAS generator 12 comprises p-channel insulated gate field effect transistors T1, T2, and T3, and n-channel field effect transistors T5, T6, and T7. The start-up portion 54 of VbeBIAS generator 14 comprises p-channel insulated gate field effect transistors T111, T211, and T311, and n-channel field effect transistors T511, T611, and T711. Startup portions 50 and 54 are essentially identical with the reference designations of transistors of control portion 54 being the same as the corresponding transistors of control portion 50 with "11" added thereto.

The generator portion of VbgBIAS generator 12 shown within a dashed line rectangle 52 comprises p-channel insulated gate field effect transistors T8, T9, and T10, n-channel insulated gate field effect transistors T11, T12, and T141, p-n-p bipolar transistors T13 and T14, and a resistor R1. The generator portion of VbeBIAS generator 14 shown within a dashed line rectangle 56 comprises p-channel insulated gate field effect transistors T15, T16, and T17, n-channel insulated gate field effect transistors T18, T19, and T21, a p-n-p bipolar transistor T20, and a resistor R2. Each of the field effect transistors has a gate, a drain, and a source. Each p-n-p transistor has a base, a collector, and an emitter.

With respect to VbgBIAS generator 12, the sources of T1, T3, T4, T8, T9, and T10 are coupled together to a common terminal 58 to which is coupled a positive voltage +VDD, which may be denoted as a supply voltage, a supply voltage source, or as a voltage source, with respect to a fixed reference potential VSS. The sources of T6, T7, and T141, and the collectors of T13 and T14 are all coupled together to a common terminal 60 to which is coupled a reference voltage VSS. VSS is typically ground potential. The gate and drain of T1 are coupled to the source of T2, to the gate of T5, and to a terminal 62. The gate and drain of T2 are coupled to the drain of T7 and to a terminal 64. The drains of T3 and T5 are coupled to the gate of T4 and to a terminal 66. The source of T5 is coupled to the drain of T6 and to a terminal 68. The drain of T4 is coupled to the drains of T9 and T11, to the gates of T11 and T12, and to a terminal 70. The gate of T3 is coupled to the gates of T9 and T10, to the drains of T8, T10, and T12, and to a terminal 74 which serves as the VbgBIAS output terminal of VbgBIAS generator 12. The source of T11 is coupled to the emitter of T13 and to a terminal 72. The source of T12 is coupled to a first terminal of R1 and to a terminal 76. A second terminal of R1 is coupled to the emitter of T14 and to a terminal 78. The bases of T13 and T14 are coupled to the drain of T141 and to a terminal 79. The gates of T6, T7, T8, and T141 are coupled to VbgEN and terminal 11.

With respect to VbeBIAS generator 14, the sources of T111, T311, T15, T16, and T17 are coupled to the terminal 58, and the sources of T711, T611, and T21 and the collector of T20 are coupled to the terminal 60. The gate and drain of T111 are coupled to the source of T211, to the gate of T511, and to a terminal 621. The gate and drain of T211 are coupled to the drain of T711 and to a terminal 640. The drains of T311 and T511 are coupled to the gate of T411 and to a terminal 660. The source of T511 and the drain of T611 are coupled to a terminal 680. The gates of T311, T16, and T17 are coupled to the drains of T15, T17, and T19 and to a terminal 82 which serves as the VbeBIAS output terminal of VbeBIAS generator 14. The drains of T411, T16, and T18 are coupled to the gates of T18 and T19, and to terminal 700. The source of T18 is coupled to the emitter of T20 and to a terminal 84. The source of T19 is coupled to a first terminal of R2 and to a terminal 86. A second terminal of R2 is coupled to the terminal 60. The base of T20 is coupled to the drain of T21 and to a terminal 85. The gates of T611, T711, T21, and T15 are coupled to terminal 11 and to VbgEN.

The start-up portion 50 of VbgBIAS generator 12 functions essentially to help insure that the generator portion 52 of VbgBIAS generator 12 turns on and reaches a desired steady state operation after the voltage +VDD applied to terminal 58 has been turned off and is then turned on and starts to return to the full level of +VDD. If VbgEN is a "1", T6, T7, and T141, are enabled, and T8 is disabled. T1 and T2 are both shown connected so as to function as diodes. T1, T2 and enabled T7 serve as a voltage divider circuit path between terminals 58 and 60. The resistance of enabled T7 is small compared to that of T1 and T2 and therefore, as terminal 58 rises in potential towards +VDD, terminal 62 rises to about one-half of the voltage of terminal 58. This enables T5. Terminal 74 is still somewhat close to the full level of +VDD, and T3 is disabled. Terminal 66 discharges through enabled T5 and T6 down to VSS. This enables T4 which then pulls up the voltage of terminal 70 towards the increasing level of the voltage of terminal 58 which is being pulled towards the nominal voltage level of +VDD. This enables T11 and T12. Also, T4 allows for a flow of current from terminal 58 therethrough and into the drain of T11 and then through the emitter to the collector of T13 and to terminal 60 and VSS. T4 also allows a flow of current to the base of T13 and then through enabled T141 to terminal 60 and VSS. The rise in the voltage of terminal 70 towards +VDD enables T12, and the path to VSS through enabled T141 enables T14. This discharges terminal 74 towards VSS until a steady-state value lower than +VDD is reached. This biases on T9 and T10 and thus establishes a first electrical path between terminals 58 and 60 through T9, T11 and T13, and a second electrical path between terminals 58 and 60 through T10, T12, R1 and T14. Thus generator portion 52 of Vbg generator 12 is set to a desired steady state operation. This voltage on terminal 74 also enables T3 (which has much lower resistance than T5 and T6) and thus causes terminal 66 to reach a level close to the full level of +VDD. This then disables T4 which stops supplying current to T11 which is already receiving drain current from T9 and no longer needs same to continue in steady state operation.

To stop the operation of Vbg generator 12 while +VDD is at the full level, VbgEN is switched to a "0". This disables T6, T7, and T141, and enables T8. The result is that no current is allowed through the electrical paths between +VDD and VSS, and that terminal 74 is pulled up to a level close to +VDD. This results in transistors T30 and T32 of FIG. 3 being disabled. Correspondingly, this also results in terminal 82 (the VbeBIAS output of VbeBIAS generator 14) being pulled to a level close to +VDD. This results in T31 and T33 of FIG. 3 being disabled. The net result is that no current flows into R4 of FIG. 3 and that the voltage of Vbg (terminal 84) is VSS.

The start-up portion 54 of VbeBIAS generator 56 functions essentially like the start-up portion 50 of VbgBIAS generator 52 and also serves to help insure that VbeBIAS generator 56 is turned on and reaches the desired steady state operation.

Voltage generator portion 52 of VbgBIAS generator 12 generates an output voltage VbgBIAS at the terminal 74. VbgBIAS is a voltage, which when applied to the gate of a p-channel field effect transistor (such as T30 and T32 of FIG. 3 that is discussed hereinbelow) current source which is coupled to the same voltage supply +VDD, gives rise to a current through the transistor which increases with increasing temperature. The voltage generator portion 56 of VbeBIAS generator 14 generates an output voltage VbeBIAS at the terminal 82. VbeBIAS is a voltage, which when applied to the gate of a p-channel field effect transistor current source which is coupled to the same voltage supply +VDD (such as T31 and T33 of FIG. 3 that is discussed hereinbelow), gives rise to a current through the transistor which decreases with increasing temperature. The structures of voltage generator portions 52 and 56 are known in the art and are known to produce VbgBIAS and VbeBIAS with the characteristics ascribed to each.

Figure 3:
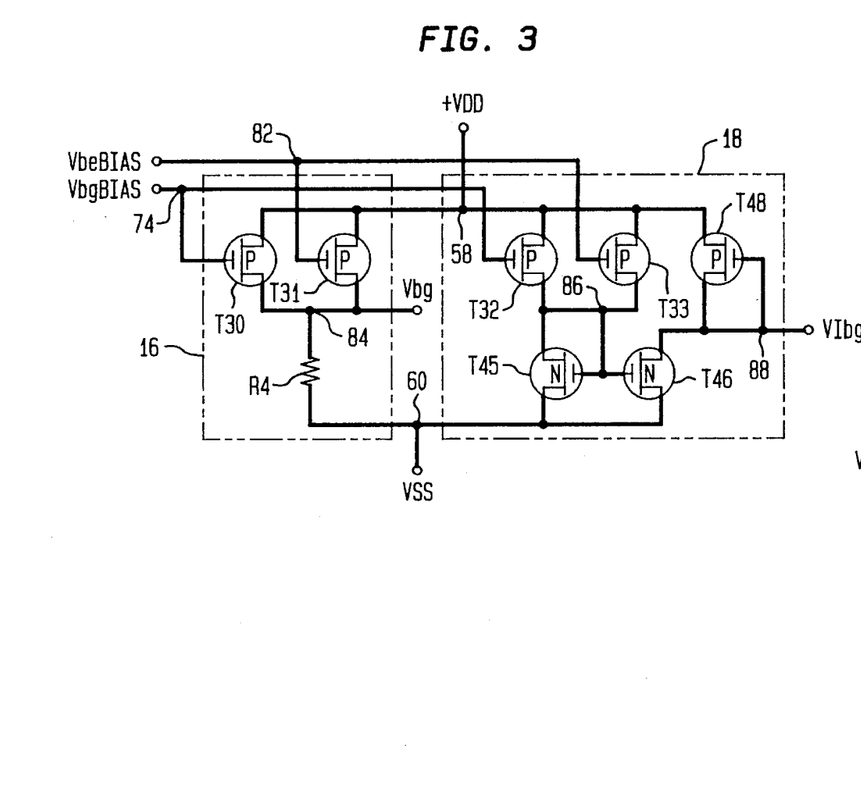
FIG. 3 shows a preferred embodiment of a Vbg generator and VIbg generator of FIG. 1.

Referring now to FIG. 3, there is shown within a dashed line rectangle 16 a preferred embodiment of Vbg generator 16 of FIG. 1, and within a dashed line rectangle 18 is shown a preferred embodiment of VIbg generator 18 of FIG. 1. Vbg generator 16 comprises p-channel insulated gate field effect transistors T30 and T31 and a resistor R4. VIbg generator 18 comprises p-channel insulated gate field effect transistors T32, T33, and T48, and n-channel insulated gate field effect transistors T45 and T46.

The gates of T30 and T32 are coupled to the terminal 74 and to the VbgBIAS output of the VbgBIAS generator 12 of FIG. 1. The gates of T31 and T33 are coupled to the terminal 82 and to the VbeBIAS output of the VbeBIAS generator 14 of FIG. 1. The sources of T30, T31, T32, T33, and T48 are all coupled to the terminal 58 which is coupled to +VDD. The sources of T45 and T46 and a first terminal of R4 are coupled to the terminal 60 and to VSS. The drains of T30 and T31 are coupled to a second terminal of R4, and to a terminal 84 which serves as the Vbg output of Vbg generator 16. The drains of T32, T33, and T45 are coupled to the gates of T45 and T46 and to a terminal 86. The gate and drain of T48 are coupled to the drain of T46, and to a terminal 88 which serves as the VIbg output of the VIbg generator 18.

Figure 5:
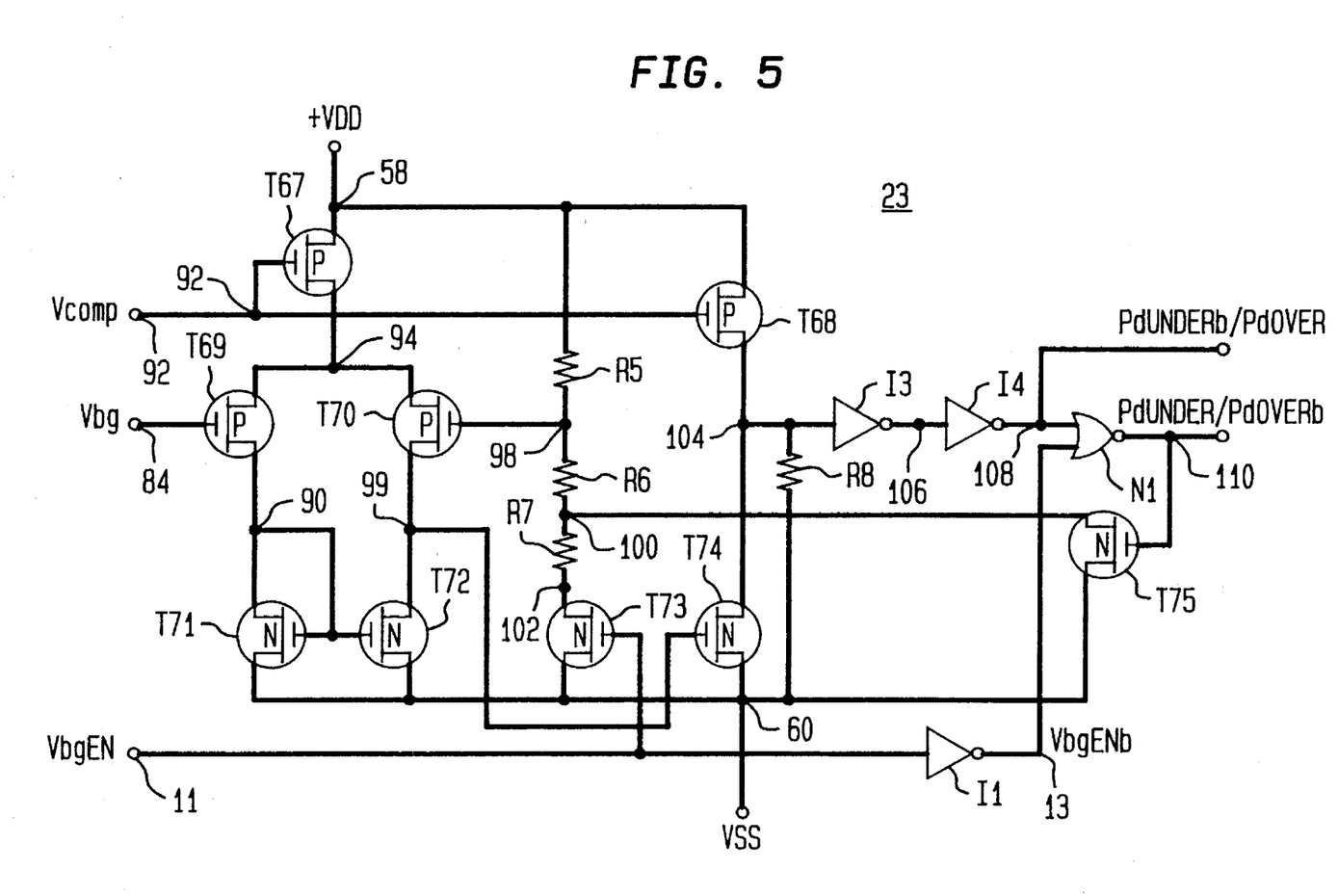
FIG. 5 shows a preferred embodiment of a voltage detector which can be used as the under and over voltage detectors of FIG. 1.

With respect to the Vbg generator 16, VgbBIAS, which is received from generator 12 of FIG. 2 and is applied at terminal 74, gives rise to a current from +VDD (terminal 58) through T30 and R4 and then into VSS (terminal 60). This current through T30 increases with temperature. VbeBIAS, which is received from generator 14 of FIG. 2 and applied at terminal 82, gives rise to a current from +VDD through T31 and R4 and then into VSS (terminal 60). This current through T31 decreases with increasing temperature. The resulting current flows through T30 and T31 are added together and flow through R4. Accordingly, with the proper sizing of T30 and T31 to ratio the respective currents in the right proportions, the current flow through R4 is essentially constant with temperature variations over a useful temperature range and produces the reference voltage Vbg (at terminal 84) whose level remains essentially constant over a useful temperature range. This reference voltage Vbg is used in a comparator of the voltage detector circuit 23 which is shown in FIG. 5 and is discussed herein below.

With respect to VIbg generator 18, VbgBIAS, which is received from generator 12 of FIG. 2 and is applied at terminal 74, gives rise to a current from +VDD through T32 and T45 and then into VSS. This current through T32 increases with temperature. VbeBIAS, which is received from generator 14 of FIG. 2 and applied at terminal 82, gives rise to a current from +VDD through T33 and T45 and then into VSS. This current through T32 decreases with increasing temperature. The resulting current flows through T32 and T33 are added together and flow through T45. Accordingly, with proper sizing of T32 and T33 to ratio the respective currents in the right proportions, the current flow through T45 is essentially constant with temperature variations over a useful temperature range. This current through T45 is mirrored into T46 since the gates of T45 and T46 are coupled together to the terminal 86. This mirrored current flows from +VDD through T48, which is configured as a diode, and T46 and then into VSS. This produces a reference voltage VIbg at terminal 88. This reference voltage VIbg, when coupled to the gate of a p-channel transistor (e.g., T60 of FIG. 4,) which is coupled to the same voltage source +VDD, generates therethrough a current which is essentially constant over a useful temperature range.

Figure 4:
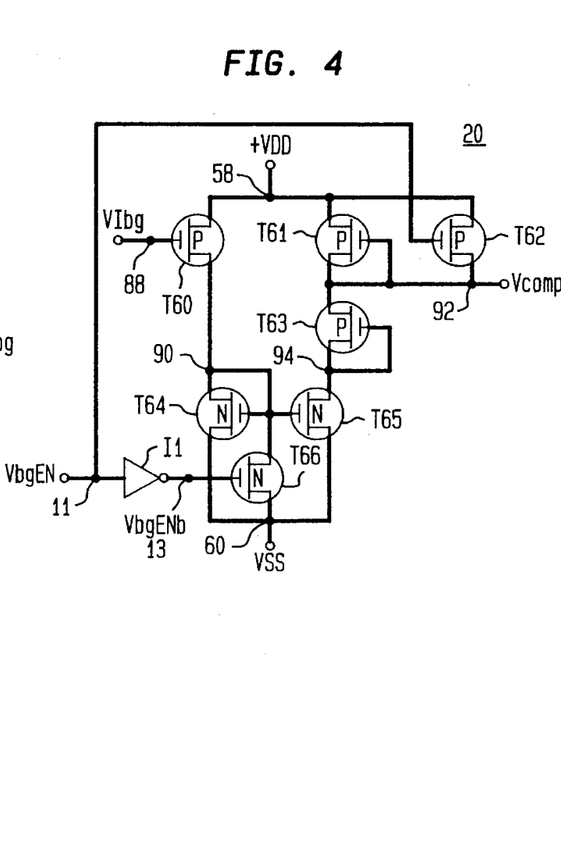
FIG. 4 shows a preferred embodiment of a Vcomp generator of FIG. 1.

Referring now to FIG. 4, there is shown a preferred embodiment of the Vcomp generator 20 of FIG. 1. The Vcomp generator 20 comprises p-channel insulated gate field effect transistors T60, T61, T62, and T63, and n-channel insulated gate field effect transistors T64, T65, and T66. There is also shown an inverter I1 which has an input coupled to the enable terminal VbgEN (also see FIG. 1) and has an output coupled to the gate of T66 and to a terminal 13. The VbgEN terminal is coupled to the gate of T62. I1 is typically a CMOS inverter consisting of a p-channel insulated gate field effect transistor having a drain thereof coupled to a drain of an n-channel insulated gate field effect transistor and to an output of the inverter. Gates of these two transistors are coupled together to an input of the inverter. The source of the p-channel transistor is coupled to +VDD and the source of the n-channel transistor is coupled to VSS. The sources of T60, T61, and T62 are all coupled to the terminal 58 which is coupled to +VDD. The source of T66 is coupled to the terminal 60 and to VSS. The drain of T60 is coupled to the drain and gate of T64, to the drain of T66, to the gate of T65, and to a terminal 90. The gate of T60 is coupled to the VIbg output of the VIbg generator 12 and to a terminal 88. The gate and drain of T61 is coupled to the drain of T62, to the source of T63, and to a terminal 92 which serves as the output terminal Vcomp of Vcomp generator 20. The gate and drain of T63 are coupled to the drain of T65 and to a terminal 94. The gate of T62 is coupled to the terminal VbgEN. An output of I1 is coupled to the gate of T66, to a terminal 13 which is also denoted as VbgENb since it receives the complement of a signal applied to terminal VbgEN.

During normal operation VbgEN (terminal 11) is a logical "1" and thus the VbgENb (terminal 13) is a logical "0". These conditions disable T62 and T66. The voltage VIbg applied to terminal 88 (which is coupled to an input of Vcomp generator 20) results in a current being generated from +VDD (terminal 58) through T60 and T64 and into VSS (terminal 60). This current is essentially independent of temperature variations over a useful range and is mirrored into a circuit leg consisting of T61, T63, and T65. The current flow through T61, T63 and T65 results in a voltage Vcomp being generated at an output terminal (terminal 92) of Vcomp generator 20. The Vcomp voltage is coupled to gates of transistors T67 and T68 of FIG. 5 and serves to generate current flows through T67 and T68 which are essentially independent of temperature over a useful temperature range. One purpose of Vcomp generator 20 is to delay the voltage VIbg before it reaches the gates of T67 and T68 as Vcomp, and therefore, to delay the current flow through T67 and T68 and to help insure that if +VDD falls below a minimum value, that current flow through T67 and T68 (see FIG. 5) is rapidly cut off before Vbg falls outside a valid authorized (preselected) operating range. If +VDD begins to fall towards VSS, the voltage across T61, T63 and T65 becomes insufficient to support conduction through therethrough. This allows Vcomp (terminal 92) to rise in level to the falling value of +VDD and thus to rapidly bias off T67 and T68 of FIG. 5.

Vcomp generator 20 serves to delay the powering up of voltage detector 23 of FIG. 5 by delaying a biasing signal on terminal 92 to allow time for the voltage level of Vbg on terminal 84 to stabilize. This limits false outputs of voltage detectors 23. Vcomp generator 20 also limits false triggering of voltage detectors 23 as +VDD drops during powering down. By disabling voltage defectors 23 by biasing off T67 and T68 of FIG. 5, Vcomp generator 20 effectively limits false triggering which can occur since Vbg can drop faster than +VDD.

Referring now to FIG. 5, there is shown a voltage detector 23 which can serve as the over voltage detector 22 of FIG. 1 or as the under voltage detector 24 of FIG. 1. Voltage detector 23 comprises p-channel insulated gate field effect transistors T67, T68, T69, and T70, n-channel insulated field effect transistors T71, T72, T73, T74, and T75, resistors R5, R6, R7, and R8, inverters I3 and I4, and a two input NOR gate N1. The resistive values selected for R5, R6, and R7 determine if voltage detector 23 serves as an over or under voltage detector by providing different voltage divider networks between +VDD and VSS which, in conjunction with T75, determine the level of the voltage of terminal 98. R5, R6, R7, and T73 form a voltage divider (translator) network between +VDD and VSS, and with T75, which may be denoted as a hysteresis means, set the voltage level of terminal 98 to be representative of the voltage level of +VDD.

As is also shown in FIG. 4 as well as in FIG. 5, the VbgEN terminal (also shown in FIGS. 1 and 2), is coupled to the inverter I1 whose output is coupled to terminal 13 which is denoted as VbgENb (also shown in FIGS. 1, 2, and 4) and represents a logical inverse of VbgEN. VbgENb (terminal 13) is also coupled to a first input of N1. VbgEN (terminal 11) is coupled to the gate of T73. Vcomp (also shown in FIGS. 1 and 4) is coupled to the terminal 92 and to the gates of T67 and T68. Vbg (also shown in FIGS. 1 and 3) is coupled to the terminal 84 and to the gate of T69.

The sources of T67 and T68 and a first terminal of R5 are coupled to the terminal 58 and to +VDD. The sources of T71, T72, T73, T74, and T75, and a first terminal of R8 are all coupled together to the terminal 60 and to VSS.

The drain of T67 is coupled to the sources of T69 and T70 and to a terminal 94. The drains of T69 and T71 are coupled to the gates of T71 and T72 and to a terminal 90. The drains of T70 and T72 are coupled to the gate of T74 and to a terminal 99. A second terminal of R5 is coupled to the gate of T70, to a first terminal of R6, and to a terminal 98. A second terminal of R6 is coupled to a first terminal of R7, to the drain of T75, and to a terminal 100. A second terminal of R7 is coupled to the drain of T73 and to a terminal 102. The drains of T68 and T74 are coupled to an input of I3, to a second terminal of R8, and to a terminal 104. An output of I3 is coupled to an input of I4 and to a terminal 106. An output of I4 is coupled to a second input of N1 and to a terminal 108 which serves as the PdUNDERb output of detector 23 when same functions as the under voltage detector 24 of FIG. 1, and as the PdOVER output of detector 23 when same functions as the over voltage detector 22 of FIG. 1. An output of N1, which is coupled to the gate of T5 and to a terminal 110, serves as the PdUNDER output of detector 23 when same functions as the under voltage detector 24 of FIG. 1, and as the PdOVERb output of detector 23 when same functions as the over voltage detector 22 of FIG. 1.

Inverters I3 and I4 cause the signal on terminal 108 to be of the same logic state as the signal on terminal 104 after a delay introduced by I3 and I4. I3 and I4 are used to help insure that essentially full +VDD and VSS levels reach the input (terminal 108) of N1 even if the voltage at terminal 104 does not reach the full levels of +VDD and VSS. I3 and I4 can be CMOS inverters of the same type described for I1.

Voltage detector 23, when used as an over voltage detector, functions to generate a logical "1" at output terminal 108 (PdOVER) and the complement thereof, a "0", at terminal 110 (PdOVERb) if +VDD is above a preselected voltage (+Vhigh) which is more positive than a preselected nominal level of +VDD. Voltage detector 23, when used as an under voltage detector, functions to generate a logical "1" at output terminal 110 (PdUNDER) and the complement thereof, a "0", at terminal 108 (PdUNDERb) if +VDD is below a preselected level (+Vlow) which is less positive than the preselected nominal level of +VDD. If VDD falls in value significantly below the preselected level (+Vlow), the level of the voltage of terminal 92 (Vcomp) rapidly changes from a level lower than the value of +VDD by a P-channel threshold voltage to a level closer to the value of +VDD. This disables T67 and T68 which would then allow terminal 104 to potentially float in potential at the previously attained potential but for R8. R8 prevents this from happening since it is connected between terminals 104 and 60 (VSS) and thus pulls terminal 104 down to VSS if T68 is disabled independent of whether T74 is enabled or disabled. The resistive value of R8 is selected to be high relative to the resistance between the drain and source of T74 when same is enabled. Thus R8 does not interfere with the operation of T68 and T74 when +VDD is within the preselected operating voltage range or relatively close thereto. Terminal 104 of an under voltage detector 23 being discharged to VSS causes terminal 108 to be pulled down to VSS and results in terminal 110 being set to a "1" output level which indicates that the voltage level of +VDD is below +Vlow, which is the correct logic state.

Transistors T67, T69, T70, T71, and T72, constitute a first stage of a comparator which functions to compare the voltage level of Vbg (terminal 84) with that of a voltage generated at terminal 98. T67 acts as a current source (generator) for the first stage of the comparator. If Vbg is less positive than the voltage of terminal 98, then terminal 99 is pulled low to a level near VSS; and if Vbg is more positive than the voltage of terminal 98, then terminal 99 is pulled high to a positive value with respect to VSS. T68, T74, and R8 constitute a second stage of this comparator with T68 acting as a current source for the second stage. If the gate (terminal 99) of T74 has a relatively high positive voltage with respect to VSS applied thereto, it is enabled and terminal 104 (which serves as the output of the second stage of the comparator) is pulled to a level close to VSS, a "0". If the gate (terminal 99) of T74 has VSS applied thereto, it is disabled and terminal 104 (which serves as the output of the second stage of the comparator) is pulled by T68 to a level close to +VDD, a "1". With T75 disabled, the voltage generated at terminal 98 with respect to VSS is +VDD(R6+R7)/(R5+R6+R7). The enabled resistance of T73 is typically assumed to be very close to zero. With T75 enabled, it acts as an essentially short circuit from terminal 100 to VSS (terminal 60). Accordingly, with T75 enabled, the voltage generated at terminal 98 is about +VDD(R6)/(R5+R6).

Detector 23 operates as follows: Assume that Vcomp (terminal 92) is at a voltage lower than +VDD by approximately a P-channel transistor threshold voltage, Vbg is at a desired level, and VbgEN is at a logical "1". These conditions cause T67, T68, and T73 to be enabled, i.e., biased on so as to be able to sustain current flow therethrough. The "1" of VbgEN is inverted by I1 which results in a "0" on terminal 13 which is coupled to the first input of NOR gate N1. This results in N1 functioning essentially as an inverter which inverts a signal applied to the second input (terminal 108) and provides the inverted signal at an output (terminal 110) thereof. With T73 enabled, it serves as low resistance path between terminal 102 and terminal 60 which is coupled to VSS. Thus an electrical path comprising R5, R6, R7 and the drain-source path of T73 is generated between +VDD (terminal 58) and +VSS (terminal 60).

With +VDD at a nominal preselected level, the voltage at terminal 98 of an under voltage detector 24 is designed to be at a level which is more positive than the voltage level of Vbg (terminal 84). As will become clear, if the voltage level of +VDD is within a preselected voltage range of +Vlow to +Vhigh around the nominal level, output terminal 110 of an under voltage detector 24 is a "0". This "0" disables T75 and thus the voltage generated at terminal 98 is +VDD(R6+R7)/(R5+R6+R7) which is more positive than Vbg (terminal 84) when +VDD is higher than +Vlow by careful selection of the relative values of R5, R6, and R7. These conditions result in current flow from +VDD through T67, T69, and T71 into VSS. This enables T72 which pulls terminal 99 to close to VSS which disables T74. T68 is enabled as a current source and pulls terminal 104 to close to +VDD, a "1". This results in terminal 108 being a "1" due to the double inversion by I3 and I4. N1 acts as an inverter which results in terminal 110 being a "0". This confirms the initial assumption that terminal 110 was a "0".

As will be shown, if under voltage detector 24 is subject to +VDD which has a voltage level which is below +Vlow, output terminal 110 is a "1". This enables T75 and thus the voltage generated at terminal 98 is about +VDD(R6)/(R5+R6) which is less positive than the voltage level of Vbg (terminal 84) even when +VDD is equal to +Vlow. This results in T69, T71, and T72 being disabled and not conducting, and in T67 and T70 being enabled and charging terminal 99 to a relatively high positive voltage relative to VSS. This relatively high voltage on terminal 99 enables T74 which pulls terminal 104 at or close to VSS, a "0". The resistance of T74 is designed relative to the resistance of T68 such that with both on and conducting the voltage of terminal 104 is close to VSS, a "0". The "0" on terminal 104 results in a "0" on terminal 108 because of the double inversion resulting from I3 and I4. N1 is acting as an inverter and thus the "0" input on terminal 108 results in a "1" on terminal 110. Accordingly, the original assumption of a "1" on terminal 110 is shown to be correct.

Hysteresis action in a voltage detector 23 of FIG. 5 which is used as an under voltage detector 24 of FIG. 1. is better understood from the following: As is described earlier herein, the values of resistors R5, R6, and R7 are selected such that +VDD(R6+R7)/(R5+R6+R7) is equal to Vbg when +VDD is equal to +Vlow. When +VDD is higher than +Vlow, the voltage generated at terminal 98 is equal to +VDD(R6+R7)/(R5+R6+R7) and is more positive than Vbg. This disables (biases off) T75. When +VDD falls below +Vlow, the voltage generated at terminal 98 is lower than Vbg. This enables (biases on) T75 and causes the voltage generated at terminal 98 to now become +VDD(R6)/(R5+R6). Accordingly, even when +VDD increases to the level of +Vlow, the voltage generated at terminal 98 is still lower than Vbg, and the output at terminal 110 is still a "1". +VDD has to increase to a level above +Vlow by an amount equal to Vbg[(R5+R6)/(R6)−(R5+R6+R7)/(R6+R7)] before the output at terminal 110 switches to a "0" to indicate normal operation. This extra voltage margin is denoted as hysteresis.

With +VDD at a nominal preselected level, the voltage at terminal 98 of an over voltage detector 22 is designed to be at a level which is less positive than the voltage level of Vbg (terminal 84). As will become clear, if the voltage level of +VDD is within a range of +Vlow to +Vhigh, output PdOVERb (terminal 110) of an over voltage detector 22 is a "1". This "1" enables T75 and thus the voltage generated at terminal 98 is at a level of +VDD(R6)/(R5+R6) which is less positive than Vbg (terminal 84) when +VDD is lower than +Vhigh by careful selection of the relative values for R5 and R6. These conditions result in T69, T71, and T72 being disabled and not conducting, and in T67 and T70 being enabled and charging terminal 99 to relatively a high positive voltage with respect to VSS. This enables T74 which pulls terminal 104 to a level close to VSS, a "0". The resistance of T74 is designed relative to the resistance of T68 such that with both on and conducting, the voltage of terminal 104 is close to VSS, a "0". The "0" on terminal 104 is inverted twice by I3 and I4 and becomes a "0" on terminal 108. N1 acts as an inverter which results in terminal 110 being a "1". This confirms the initial assumption that terminal 110 was a "1".

As will be shown, if over voltage detector 22 is subject to +VDD which has a voltage level which is above +Vhigh, output PdOVERb (terminal 110) is a "0". This disables T75 and thus the voltage generated at terminal 98 is +VDD(R6+RT)/(R5+R6+RT) which is more positive than the voltage level of Vbg (terminal 84) by careful selection of the relative values of R5, R6, and R7. These conditions result in current flow from +VDD through T69, T71, and T72 being enabled. This causes terminal 99 to be pulled low close to VSS, a "0", which disables T74. This results in terminal 104 being pulled high close to +VDD, a "1", through conducting T68. The "1" on terminal 104 is inverted twice by I3 and I4 and becomes a "1" on terminal 108. The "1" at the input (terminal 108) of N1 results in a "0" on terminal 110. Accordingly, the original assumption of a "0" on terminal 110 is shown to be correct.

T75, which may be denoted as hysteresis means, adds hysteresis to the divider network which includes R5, R6, R7, T73 and T75. When enabled, T75 lowers the resistance between terminals 58 and 60 by effectively shorting out R7 and T73. This results in a change in the voltage generated at terminal 98 which affects when the first stage of the comparator switches. This hysteresis increases noise margin of the comparator and thus helps to limit false triggering due to noise glitches.

Hysteresis action in a voltage detector 23 of FIG. 5 which is used as an over voltage detector 22 of FIG. 1 is better understood from the following: As described earlier herein, the values of resistors R5, R6, and R7 are selected such that +VDD(R6)/(R5+R6) is equal to Vbg when +VDD is equal to +Vhigh. It was shown earlier that when +Vdd starts out lower than +Vhigh, the voltage generated at terminal 98 is equal to +VDD(R6)/(R5+ R6) and is lower than Vbg. This keeps T75 enabled (biased on). As +VDD gets higher than +Vhigh, the voltage generated at terminal 98 becomes higher than Vbg. This turns off (biases off) T75 such that the voltage generated at terminal 98 now becomes +VDD(R6+R7)/(R5+R6+R7). This means that when +VDD comes back down to +Vhigh, the voltage generated at terminal 98 is still higher than Vbg and the voltage at terminal 110 is still a "0". +VDD has to go below +Vhigh by an amount equal to Vbg[(R5+ R6)/(R6)–(R5+R6+R7)/(R6+R7)] before the output of terminal 110 switches to a "1" to indicate normal conditions. This extra voltage margin is denoted as hysteresis.

In an illustrative embodiment, in voltage detector 23, when used as the under voltage detector 24 of FIG. 1 and with +VDD having a nominal level of +3.3 volts, R5=3200 ohms, R6=900 ohms, R7=28 ohms, and R8=150,000 ohms for Vbg=600 millivolts, +Vlow=2.640 volts and hysteresis =80 millivolts. When voltage detector 23 is used as the over voltage detector 22 of FIG. 1 and with VDD=+3.3 volts, R5=5600 ohms, R6=1000 ohms, R7=19 ohms, and R8=150,000 ohms for Vbg=600 millivolts, +vhigh=4.09 volts, and hysteresis =80 millivolts.

Figure 6:
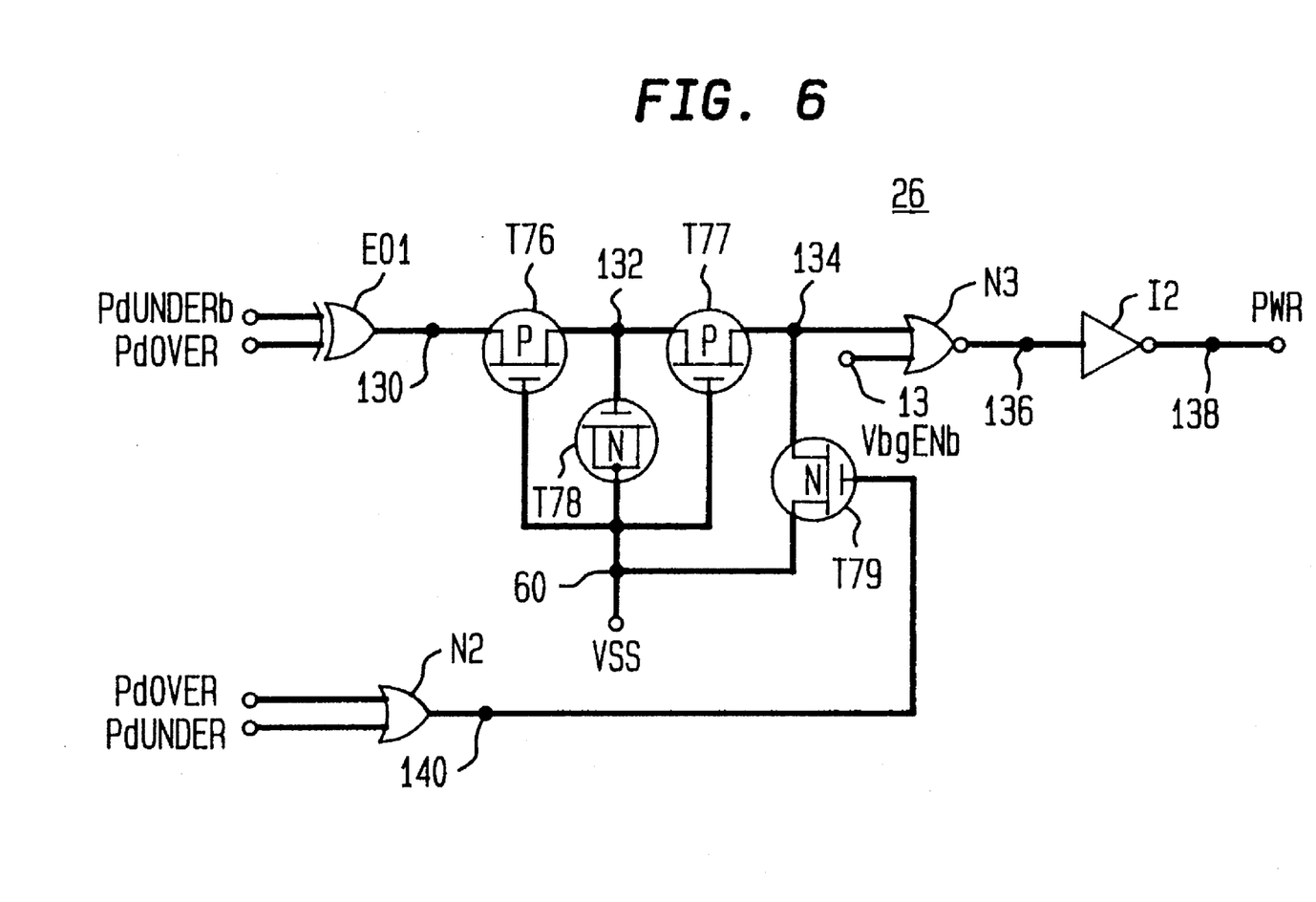
FIG. 6 shows a preferred embodiment of output logic circuitry of FIG. 1.

Referring now to FIG. 6, there is shown a preferred embodiment of the output logic circuitry 26 of FIG. 1. Output logic circuitry 26 comprises a two input EXCLUSIVE OR gate EO1, a two input OR logic gate N2, a two input NOR logic gate N3, p-channel insulated gate field effect transistors T76 and T77, an inverter I2, and n-channel insulated gate field effect transistors T78 and T79. The PdUNDERb output of FIGS. 1 and 5 is coupled to a first input of EO1, and the PdOVER output of FIGS. 1 and 5 is coupled to a second input of EO1. The PdOVER output of FIGS. 1 and 5 is coupled to a first input of N2, and the PdUNDER output of FIGS. 1 and 5 is coupled to a second input of N2. The gates of T76 and T77, and the source and drain of T78 are coupled to the terminal 60 and to VSS. T76 and T78 are connected so as to function as resistors or as resistive means. T78 is connected so as to function as a capacitor. T76, T77, and T78 may be denoted as delay means. An output of N2 is coupled to the gate of T79 and to a terminal 140. I2 can be of the same type as I1, I3, and I4. N2 and T79 may be denoted as first means, and EO1 may be denoted as second means.

An output of EO1 is coupled to the source of T76 and to a terminal 130. The drain of T76 is coupled to the source of T77, to the gate of T78, and to a terminal 132. The drains of T77 and T79 are coupled to a first input of N3 and to a terminal 134. VbgENb (terminal 13) is coupled to a second input of N3. An output of N3 is coupled to an input of inverter I2 and to a terminal 136. An output of I2 is coupled to a terminal 138 which serves as an output (PWR) of output logic circuitry 26 and of power-out reset system 10 of FIG. 1. N3 serves as an inverter when the VbgENb input signal to an input thereof is a "0".

Output logic circuitry 26 functions to generate a logical "1" at PWR (terminal 138) if +VDD is within the nominal preselected operating voltage range (+Vhigh to +Vlow) and to generate a "0" if it is not. The combination of T76, T77, and T78 acts as a delay element which delays a signal generated at the output of EO1 (terminal 130) from reaching a first input (terminal 134) of N3. T79, when enabled (i.e., has a "1" applied to the gate thereof), provides a low resistance path from terminal 134 to VSS which facilitates the rapid pulling of the voltage of terminal 134 to VSS. T79 is enabled when the voltage level of +VDD assumes a voltage level which is above or below the preselected operating voltage range. Accordingly, if one of the inputs PdUNDER or PdOVER is a "1", which indicates that the voltage level of +VDD is outside the preselected operating voltage range, then the output (terminal 140) of OR gate N2 is a "1". This "1" causes T79 to be enabled and to rapidly pull terminal 134 to VSS. If PdOVER then switches from a "1" to a "0" while PdUNDER is also a "0", then terminal 140 becomes a "0" and T79 is disabled and has no effect on this circuit. This is indicative of +VDD returning to a voltage level within the preselected operating voltage range. Since Pdunder is a "0", Pdunderb is a "1". A "1" at Pdunderb combined with a "0" at Pdover causes the output of EO1 (terminal 130) to go high. The "1" at terminal 130 propagates through the RC delay network comprising T76, T77, and T78 to terminal 134. It then propagates through N3 and I2 and reaches output terminal 138 (PWR) after a delay associated with N3 and I2. This provides protection against a momentary return of +VDD to the nominal level due to a noise spike. T79 plays no role at this time since it is disabled.

Assuming that VbgEnb (terminal 13) is a "0" and that +VDD is within the preselected operating voltage range, then PdUNDERb is a "1" PdUNDER is a "0" and PdOVER is a "0" Under these conditions the output of EO1 (terminal 130) is a "1" and the output of N2 (terminal 140) is a "0". This disables T79 and allows the "1" at terminal 130 to propagate through T76 and T77 and cause the voltage of terminal 134 to be a "1". N3 serves to invert this "1" and to generate a "0" at terminal 136. The "0" at terminal 136 is inverted by I2 and becomes a "1" at output PWR (terminal 138). The "1" output at terminal 138 is indicative of the level of +VDD being within the preselected voltage range.

Now assume the case in which +VDD is outside the preselected voltage range on the low side (i.e., less positive than +Vlow) and VbgENb is a "0". Under these conditions PdUNDERb is a "0", PdUNDER is a "1", and PdOVER is a "0". The output (terminal 140) of N2 is a "1" which causes T79 to be enabled and to rapidly pull terminal 134 to VSS. The output (terminal 130) of EO1 is a "0", a level at or close to VSS. This "0" on terminal 130 propagates to terminal 134 after the delay associated with T76, T77 and T78. Since the "0" is already at terminal 134, N3 generates a "1" at terminal 136 and then I2 generates a "0" at the PWR output (terminal 138). The "0" output at terminal 138 indicates that the level of +VDD is outside the preselected voltage range.

Now assume the case in which +VDD is outside the preselected voltage range on the high side (i.e., more positive than +Vhigh) and VbgENb is a "0". Under these conditions PdUNDERb is a "1", PdUNDER is a "0" and PdOVER is a "1" N2 generates a "1" on terminal 140 which causes T79 to be enabled and to thus rapidly pull terminal 134 to VSS. The output of EO1 is a "0", a level at or close to VSS. This "0" at terminal 130 propagates to terminal 134 after the delay associated with T76, T77 and T78. Since the "0" is already at terminal 134, N3 generates a "1" at terminal 136 and then I2 generates a "0" at the PWR output (terminal 138). The "0" output at terminal 138 indicates that the level of +VDD is outside the preselected voltage range.

Various other changes and modifications in the power-out reset system illustrated herein may occur to those skilled in the art and may be made without departing from the spirit or scope of the invention as set forth and as defined in the claims. For example, OR logic gate N2 of FIG. 6 could be replaced with a NOR logic gate having an input coupled to an inverter whose output would be coupled to the gate of T79. Still further, the first and second stages of the comparator of the voltage detector 23 of FIG. 5 can be modified in a variety of ways.

What is claimed is:

1. Circuitry for detecting if a voltage level of a voltage source exceeds preselected voltage levels comprising:

reference voltage generator means for generating first and second reference voltages at first and second outputs, respectively, thereof;

delay/disable means, which has an input coupled to the second output of the reference voltage generator means, and which has an output, for generating, after a predetermined delay, a third reference voltage at the output of the delay/disable means, and for generating a disable output signal at the output of the delay/disable means if the voltage level of the voltage source is below a minimum level;

voltage detector means, which has a first input which is coupled to the first output of the reference voltage generator means, which has a second input coupled to the output of the delay/disable means, and which has a third input coupled through a voltage translator network thereof to a voltage source terminal, the voltage source terminal being connectable to the voltage source, for detecting if the voltage level of the voltage source is within the preselected voltage levels and for generating at outputs thereof signals indicative of whether the voltage level of the voltage source is within or outside the preselected voltage levels, and for being disabled if the voltage level of the voltage source is below the minimum level.

2. Circuitry for detecting if a voltage level of a supply voltage source exceeds preselected voltage levels comprising:

reference voltage generator means for generating first and second reference voltages at first and second outputs, respectively, with the first voltage being characterized by being independent of temperature variations over a useful temperature range;

delay/disable means, which comprises a first current generator coupled to an input thereof, which has an output, and which has the input thereof coupled to the second output of the reference voltage generator means, for generating at the output thereof a third reference voltage;

the second reference voltage being characterized in that with same coupled to the first current generator there results in generation in the first current generator of a current having a level which is essentially independent of temperature variations over a useful temperature range;

voltage detector means, which comprises a second current generator coupled to a first input thereof which is coupled to the output of the delay/disable means, which has a second input thereof coupled to the first output of the reference voltage generator means, and which has a third input coupled through a first voltage translator network thereof to a supply voltage source terminal, the supply voltage source terminal being connectable to the supply voltage source;

the third reference voltage being characterized in that with same coupled to the second current generator there results in generation of a current in the second current generator which is essentially independent of temperature variations over a useful temperature range; and the voltage detector means being for detecting if the voltage level of the voltage source is within the preselected voltage levels and for generating at outputs thereof signals indicative of whether the voltage level of the voltage source is within or outside the preselected voltage levels, and for being disabled if the voltage level of the voltage source is below the minimum level.

3. The circuitry of claim 2 wherein the delay/disable means comprises:

a first circuit leg having an input coupled to the second output of the generator means;

a second circuit leg coupled in a current mirror configuration to the first circuit leg and having an output which is coupled to the input of the voltage detector means;

first circuit means coupled to the first and second circuit legs for facilitating current flow therethrough; and second circuit means coupled to the output of the second circuit leg for generating a disabling signal at the output of the delay/disable means.

4. The circuitry of claim 3 wherein:

the first circuit leg comprises a first field effect transistor of a first conductivity, and a second field effect transistor of the opposite conductivity type;

the second circuit leg comprises third and fourth field effect transistors of the first conductivity type and a fifth field effect transistor of the opposite conductivity type;

the first circuit means comprises a sixth field effect transistor of the opposite conductivity type, and the second circuit means comprises a seventh field effect transistor of the first conductivity type;

each of the first, second, third, fourth, fifth, sixth, and seventh transistors having a gate and first and second outputs;

the first outputs of the first, second, and sixth transistors being coupled together and being coupled to the gates of the second and fifth transistors;

the first outputs of the third, fourth and seventh transistors being coupled together to the gate of the third transistor and to the output of the delay/disable means; and the second output and the gate of the fourth transistor being coupled to the first output of the fifth transistor.

5. The circuitry of claim 4 wherein the gate of the seventh transistor is coupled to a disable/enable terminal and the gate of the sixth transistor is coupled to an enable/disable terminal.

6. The circuitry of claim 5 wherein all of the transistors are insulated gate field effect transistors.

7. The circuitry of claim 6 wherein the second outputs of the first, third, and seventh transistors are coupled together to a first power supply terminal, and the second outputs of the second, fifth, and sixth transistors are coupled together to a second power supply terminal.

8. The circuitry of claim 2 wherein the voltage detector means comprises:

over voltage detector means, which comprises a first input coupled to the output of the delay/disable means, has a second input coupled to the first output of the reference voltage generator means, and has a third input coupled through the first voltage translator network thereof to the supply voltage source terminal, for detecting if the voltage level of the supply voltage source exceeds an upper limit of the preselected voltage levels and for generating at an output thereof a signal indicative of whether the voltage level of the supply voltage source is below the upper limit of the preselected voltage levels or greater than same; and under voltage detector means, which comprises a first input coupled to the output of the delay/disable means, has a second input coupled to the first output of the reference voltage generator means, and has a third input coupled through a second voltage translator network thereof to the supply voltage source terminal, for detecting if the voltage level of the supply voltage source exceeds a lower limit of the preselected voltage levels and for generating at an output thereof a signal indicative of whether the voltage level of the supply voltage source is above the lower limit of the preselected voltage range or less than same.

9. The circuitry of claim 2 wherein the voltage detector means further comprises hysteresis means, which has an output coupled to the voltage translator network and has an input coupled to an output of the voltage detector, for selectively modifying a voltage generated at the third input of the voltage detector means so as to improve noise margin.

10. The circuitry of claim 9 wherein:

the voltage translator network being a divider network which comprises a plurality of serially connected resistive elements each having first and second terminals; and the hysteresis means comprises a first switching means having first and second outputs and a control terminal, the first output of the hysteresis means being coupled to the first terminal of one of the resistive elements, and the control terminal of the first switching means being coupled to the output of the voltage detector.

11. The circuitry of claim 10 wherein the first switching means comprises a first field effect transistor of a first conductivity type having a gate coupled to the voltage detector output and having first and second outputs with the first output coupled to the first terminal of one of the resistive elements, and the first and second outputs of the first switching device being the same as the first and second outputs, respectively, of the switching means.

12. The circuitry of claim 11 wherein:

the first current generator comprises a second field effect transistor of the opposite conductivity type having a gate coupled to the second output of the reference voltage generator means and having first and second outputs;

the voltage detector means comprises third, fourth, and fifth field effect transistors of the first conductivity type and sixth, seventh, and eighth field effect transistors of the opposite conductivity type, and a two input NOR gate;

each of the transistors having a gate and first and second outputs;

the gates of the first and eighth transistors being coupled together to the first input of the voltage detector means;

the gate of the sixth transistor being coupled to the second input of the voltage detector means;

the gate of the seventh transistor being coupled to an output of the divider network;

first outputs of the second, sixth and seventh transistors being coupled together;

the second output of the sixth transistor being coupled to the first output and gate of the third transistor and to the gate of the fourth transistor;

the second output of the seventh transistor being coupled to the first output of the fourth transistor and to the gate of the fifth transistor;

the first outputs of the fifth and eighth transistors being coupled to the first input of the NOR gate; and the output of the NOR gate being coupled to the gate of the first transistor.

13. The circuitry of claim 12 wherein the voltage detector means further comprises a first resistor having a first terminal coupled to the first outputs of the fifth and eighth transistors.

14. The circuitry of claim 13 wherein the voltage detector means further comprises:

first and second inverters each having an input and an output;

the input of the first inverter being coupled to the first terminal of the first resistor and the output of the first inverter being coupled to the input of the second inverter; and the output of the second inverter being coupled to the first input of the NOR gate such that the first outputs of the fifth and eighth transistors are coupled to the first input of the NOR gate through the first and second inverters.

15. The circuitry of claim 14 wherein: the plurality of serially connected resistive elements of the divider network comprises second, third, and fourth resistors each having first and second terminals, and the divider network further comprising a ninth field effect transistor of the first conductivity type and having a gate and first and second outputs;

the first terminals of the second and third resistors being coupled to the gate of the seventh transistor;

a second terminal of the third resistor being coupled to the first terminal of the fourth resistor and to the first output of the first transistor;

a second terminal of the fourth resistor being coupled to the first terminal of the ninth transistor; and the second terminals of the first and ninth transistors being coupled together.

16. The circuitry of claim 15 wherein:

the second outputs of the first, third, fourth, fifth, and ninth transistors are coupled together; and the second outputs of the second and eighth transistors are coupled together.

17. The circuitry of claim 16 wherein the voltage detector means further comprises a third inverter having an input coupled to a fourth input of the voltage detector and having an output coupled to the second input of the NOR gate.

18. The circuitry of claim 17 wherein the first conductivity is n-type and the opposite conductivity is p-type.

19. The circuitry of claim 2 further comprising output logic circuitry means, which has inputs coupled to the outputs of the voltage detector means and has an output which serves as the circuitry output, for processing signals received from the voltage detector means and generating an output signal that that indicates if the voltage level of the supply voltage source is within the preselected voltage range or outside of same, and if the voltage level of the supply voltage source had exceeded the preselected voltage levels and then changed to a level within the preselected voltage range, for delaying a change in an output signal generated at the output circuitry terminal.

20. The circuitry of claim 19 wherein the output logic circuitry means comprises:
- a delay circuit having a first end coupled to the output of the circuitry;
- a first logic circuit, which has inputs coupled to the outputs of the voltage detector means and an output coupled to a second end of the delay circuit, for detecting if the voltage level of the voltage source is within the preselected voltage range;
- switching means, which has a control terminal, a first output terminal coupled to the circuitry output, and has a second output terminal coupled to a reference voltage terminal, for selectively causing the circuitry output to be coupled to the reference voltage terminal; and
- a second logic circuit having inputs coupled to the outputs of the voltage detector means, and having an output coupled to the control terminal of the switching means.

21. The circuitry of claim 20 wherein:
- the first logic circuit comprises a two input EXCLUSIVE OR logic gate; and
- the switching means comprises a first field effect transistor having a gate coupled to an output of the second logic circuit, a first output coupled to the circuitry output, and a second output coupled to the reference voltage terminal.

22. The circuitry of claim 21 wherein the output logic circuitry means further comprises:
- a two input NOR gate having an output;
- an inverter having an input and an output;
- the second logic circuit being an OR logic gate;
- a first input of the NOR gate being coupled to the first end of the delay circuit and to the first output of the first transistor; and
- the output of the NOR gate being coupled to the input of the first inverter, and the output of the inverter being coupled to the circuitry output.

23. The circuitry of claim 22 wherein the delay circuit comprises an equivalent of a resistor-capacitor network.

24. The circuitry of claim 23 wherein the equivalent resistor-capacitor network comprises:
- second, third and fourth field effect transistors each having a gate and first and second outputs;
- the first output of the second transistor being coupled to the output of the EXCLUSIVE OR gate;
- the second output of the second transistor being coupled to the first output of the fourth transistor and to the gate of the third transistor;
- the second output of the fourth transistor being coupled to the first output of the first transistor; and
- the gates of the second and fourth transistors being coupled to the first and second outputs of the third transistor and to the reference voltage terminal.

25. The circuitry of claim 24 wherein:
- the first and third transistors are n-channel field effect transistors and the second and fourth transistors are p-channel field effect transistors.

26. The circuitry of claim 25 wherein the first, second, third, and fourth transistors are all insulated gate field effect transistors.

27. Circuitry for detecting if a voltage level of a voltage source exceeds preselected voltage levels comprising:
- reference voltage generator means for generating first and second reference voltages at first and second outputs, respectively, thereof;
- delay/disable means, which has an input coupled to the second output of the reference voltage generator means, and which has an output, for generating, after a predetermined delay, a third reference voltage at the output of the delay/disable means, and for generating a disable output signal at the output of the delay/disable means if the voltage level of the voltage source is below a minimum level;
- voltage detector means, which has a first input which is coupled to the first output of the reference voltage generator means, which has a second input coupled to the output of the delay/disable means, and which has a third input coupled through a voltage translator network thereof to a voltage source terminal, the voltage source terminal being connectable to the voltage source, for detecting if the voltage level of the voltage source is within the preselected voltage levels and for generating at an output thereof a signal indicative of whether the voltage level of the voltage source is within or outside the preselected voltage levels, and for being disabled if the voltage level of the voltage source is below the minimum level;
- the voltage detector means comprising hysteresis means which is coupled to the voltage translator network, and which has an input coupled to an output of the voltage detector means, for selectively modifying a voltage generated at the third input of the voltage detector means such that an output signal of the voltage detector means has an increased tendency not to switch states due to relatively short duration changes in the voltage level of the voltage source due to noise; and
- output logic circuitry means, which has inputs coupled to outputs of the voltage detector means, and which has an output which serves as the circuitry output, for processing signals received from the voltage detector means and generating an output signal that that initiates if the voltage level of the voltage source is within the preselected voltage levels or outside of same, and if the voltage level of the voltage source had exceeded the preselected voltage levels and then returned to a voltage level within the preselected voltage levels, for delaying any change in a signal generated at the output circuitry terminal such that a resulting output signal at the circuitry output terminal has an increased tendency not to switch states due to relatively short duration changes in the voltage level of the voltage source due to noise after the output logic circuitry means has provided an output signal at the output thereof indicating the voltage level of the voltage source is outside the preselected voltage levels.

28. Circuitry for detecting if a voltage level of a supply voltage source exceeds preselected voltage levels comprising:
- reference voltage generator means for generating first and second reference voltages at first and second outputs, respectively, with the first voltage being characterized by being independent of temperature variations over a useful temperature range;
- delay/disable means, which comprises a first current generator coupled to an input thereof, which has an output and has the input thereof coupled to the second output of the reference voltage generator means, for generating at an output thereof a third reference voltage;

the second reference voltage being characterized when same is coupled to the first current generator there results in generation of a current having a level which is essentially independent of temperature variations over a useful temperature range being generated by the first current generator;

voltage detector means, which comprises a second current generator coupled to an input thereof which is coupled to the output of the delay/disable means, which has a second input thereof coupled to the first output of the reference voltage generator means, and which has a third input coupled through a first voltage translator network thereof to a supply voltage source terminal, the supply voltage source terminal being connectable to the supply voltage source;

the third reference voltage being characterized in that when same is coupled to the second current generator there results in the generation of a current level in the second current generator which is essentially independent of temperature variations over a useful temperature range;

the voltage detector means being for detecting if the voltage level of the supply voltage source is within the preselected voltage levels and for generating at outputs thereof signals indicative of whether the voltage level of the supply voltage source is within or outside the preselected levels, and for being disabled if the voltage level of the supply voltage source is below the minimum level;

the voltage detector means further comprising hysteresis means which is coupled to the voltage translator network and has an input coupled to an output of the voltage detector means, for selectively modifying a voltage generated at the third input of the voltage detector means such that an output signal of the voltage detector means has an increased tendency not to switch states due to relatively short duration changes in the voltage level of the supply voltage source due to noise; and output logic circuitry means, which has inputs coupled to outputs of the voltage detector means and has an output which serves as the circuitry output, for processing signals received from the voltage detector means and generating an output signal that that indicates if the voltage level of the supply voltage source is within the preselected voltage levels or outside of same, and if previously thereto the voltage level of the supply voltage source had exceeded the preselected voltage levels, for delaying any change in a signal generated at the output circuitry terminal such that a resulting output signal at the circuitry output terminal has an increased tendency not to switch states due to relatively short duration changes in the voltage level of the supply voltage source due to noise after same has provided a signal indicating the voltage level of the supply voltage source is outside the preselected limits.

29. The circuitry of claim 28 wherein the voltage detector means comprises:

over voltage detector means, which comprises a first input coupled to the output of the delay/disable means, has a second input coupled to the first output of the reference voltage generator means, and has a third input coupled through the first voltage translator network thereof to the supply voltage source terminal, for detecting if the voltage level of the supply voltage source exceeds an upper limit of the preselected voltage levels and for generating at an output thereof a signal indicative of whether the voltage level of the supply voltage source is below the upper limit of the preselected voltage levels or greater than same;

under voltage detector means, which comprises a first input coupled to the output of the delay/disable means, has a second input coupled to the first output of the reference voltage generator means, and has a third input coupled through a second voltage translator network thereof to the supply voltage terminal, for detecting if the voltage level of the supply voltage source exceeds a lower limit of the preselected voltage levels and for generating at an output thereof a signal indicative of whether the voltage level of the supply voltage source is above the lower limit of the preselected voltage range or less than same; and the output logic circuitry means having inputs coupled to outputs of the under and over voltage detector means.

* * * * *